United States Patent
Schäfer

[11] Patent Number: 5,804,256
[45] Date of Patent: Sep. 8, 1998

[54] METHOD AND DEVICE FOR COATING PRINTED-CIRCUIT BOARDS

[76] Inventor: Hans-Jorgen Schäfer, Ritterstrasse 36, D-41749, Viersen, Germany

[21] Appl. No.: 765,076
[22] PCT Filed: Jun. 14, 1995
[86] PCT No.: PCT/EP95/02309
§ 371 Date: Dec. 23, 1996
§ 102(e) Date: Dec. 23, 1996
[87] PCT Pub. No.: WO96/00492
PCT Pub. Date: Jan. 4, 1996

[30] Foreign Application Priority Data

| Jun. 23, 1994 | [DE] | Germany | 4421966.0 |
| Aug. 12, 1994 | [DE] | Germany | 4428713.5 |
| Sep. 26, 1994 | [DE] | Germany | 4434218.7 |
| Dec. 12, 1994 | [DE] | Germany | 4444086.3 |
| Jan. 3, 1995 | [DE] | Germany | 19500021.8 |
| Mar. 23, 1995 | [DE] | Germany | 19510227.4 |
| May 8, 1995 | [DE] | Germany | 19516193.9 |

[51] Int. Cl.⁶ .................................................. B05D 3/06
[52] U.S. Cl. .................. 427/558; 118/224; 118/227; 118/249; 118/641; 427/96; 427/98; 427/211; 427/385.5; 427/443.2; 427/508; 427/559; 427/595
[58] Field of Search ...................... 427/508, 558, 427/559, 595, 98, 96, 211, 385.5, 443.2; 118/641, 224, 227, 249

[56] References Cited

FOREIGN PATENT DOCUMENTS

| 94 07 930.7 | 7/1995 | Germany . |
| 6-084780 | 6/1994 | Japan . |
| 1 149 339 | 4/1968 | United Kingdom . |
| 21 11 313 | 6/1983 | United Kingdom . |
| WO92/07679 | 5/1992 | WIPO . |

Primary Examiner—Bernard Pianalto
Attorney, Agent, or Firm—Herbert Dubno; Yuri Kateshov

[57] ABSTRACT

The method of forming a multilayer printed circuit board includes applying a photopolymerizable coating append having a solid content of 70 to 95% by weight and a viscosity of 10 to 60 Pa.s of 25° C. to a surface of the applicator cooled to a temperature of 5° C. by a metering roll surface of which is controllably maintained at a temperature range from 25° to 60° C., so that the coating agent is deposited on opposite sides of a board and has an application viscosity of 20 to 100 Pa.s at a coating speed of 5 to 20 m/min to form a film thickening of 10 to 200 μm.

10 Claims, 5 Drawing Sheets

METHOD AND DEVICE FOR COATING PRINTED-CIRCUIT BOARDS

SPECIFICATION

CROSS REFERENCE TO RELATED APPLICATIONS

This application is a National Phase application of PCT/EP 95/22309 filed 14 Jun. 1995 and based, in turn, on German National applications P 44 21 966.0 filed 23 Jun. 1994; P 44 28 713.5 filed 12 Apr. 1994; P 44 314 218.7 filed 26 Sep. 1994; P 44 44 086.3 filed 12 Dec. 1994; 195 00 021.8 filed 3 Nov. 1995; 195 10 227.4 filed 23 Mar. 1995 and 195 16 193.9 filed 28 May 1995 under the International Convention.

FIELD OF THE INVENTION

The invention relates to a method of coating printed-circuit boards with an electromagnetically cross-linkable coating agent, preferably an agent cross linkable with UV radiation, the preamble of patent claim 1, as well as to a method of manufacturing multi-chip-modules from printed-circuit boards and to, a device carrying the methods.

BACKGROUND OF THE INVENTION

In the manufacture of printed circuits and, the so-called printed-circuit boards, for a conductor pattern, etch resists are applied in a silk screening process which corresponds to the structure of the desired conductor pattern. The etch resist is a lacquer system which, upon drying or exposure to UV radiation, gives rise to an adhesive-free surface resistant to the etching agent and which, after the etching of the laser pattern, can be again removed with so-called strippers in a 5% potassium hydroxide solution.

This type of conductor pattern generation is the most economical and therefore the most used in consumer electronics.

However this technique permits only the reproduction of conductor widths up to 300 $\mu$m with sufficient precision. In commercial electronics for the last twenty years there has been a transition to the generation of the laser pattern photographically. For this purpose, dry film resists are laminated by rollers onto printed-circuit boards. The layer pattern is fixed by the use of a photo mask via UV radiation, whereby depending upon the process, either the conductors or the conductor-free regions are photopolymerized.

The pattern generation for etching technology requires only thicknesses of several micrometers. Since this cannot be realized with foils, photosensitive liquid resists have been applied to both sides of the board with profiled rollers. The kind and number of profile grooves determined the amount of material applied. As a consequence, the process is a profile-volume-defined application whereby the application rollers serve as metering rollers. The profile grooves enable a defined volume application with low viscosity and high application pressure.

After the generation of the conductor image, the circuit is provided with a solder-stop mask which leaves only the region to be soldered free. This solder-stop mask is also applied in a silk screening process and hardened thermally as well as by UV radiation.

For commercial printed-circuit board technology, this silk screening process has also been rendered no longer usable with increasing integration.

Thus, in EP A1 0002 040 a process for applying a liquid photopolymer in a curtain casting process has been proposed.

Furthermore, in DE 36 13 107 A1, resist color compositions are described which are applied by silk screening with an empty screen over the entire surface and which is fed structurably with UV radiation. Furthermore, dry film resists also are applied with laminating rolls with application of vacuum. The curtain casting process is limited by the high solvent content and thus cannot be used for thick layers.

The silk screen process has its limits in the technology of the screen so that no layer thicknesses of 10 $\mu$m and also no layer thicknesses of 100 $\mu$m can be applied in acceptable quality.

The dry film also cannot be applied in layer thicknesses of 10 $\mu$m and thicker coatings cannot be used for the production of multilayer circuits of multi-chip-modules since they are not metallizable.

In WO 92/07 679 a roll coating process is described for one and both side coating of printed-circuit boards, especially with solder-stop lacquer. This process operates in a viscosity range of 300 to 5000 mPa.s. For generation of a conductor coating of 2 to 10 $\mu$m which in no way satisfies the requirements of printed-circuit board technology, after a dry coating a second coating process is required.

This is neither economical nor qualitatively tolerable.

In PTC/IB 94 00102, a roll coating process is described which starts from a one-time coating with meltable resists at high temperature. This process can only be carried out with newly developed meltable coating agents. A use of commercial resists is not possible since they are not meltable resists.

For the use of a resist, as is desired by the invention in the manufacture of multi-chip-modules, a higher filler component is required by comparison with the earlier systems which cannot be realized except with difficulty with meltable resists.

The increasing miniaturization gives rise to integrated circuits with ever higher numbers of terminals so that terminal pads with widths smaller than 0.5 mm are required.

In one developmental direction, fine pitches with massive solder deposits dominate as is described in DE 41 37 045 A1; in another development attempts are made to provide a number of planes and to develop four-layer circuits which have at the outer layers a so-called "pads only design" so that pad widths of 100 $\mu$m are realizable.

Such multi-chip-modules have been described in the journal Galvanotechnik No. 1,1994 as DYCOstrate circuits. For these circuits flexible polyimide basic materials serve as the construction basis. Since the bores require the most place, this process utilizes the possibility that microbores of 50 $\mu$m can be etched in the polyimide foil by a plasma treatment.

The process is however very expensive especially because of the thin and expensive substrates.

In the journal Galvanotechnik No. 12, 1994, the so-called BUM (build up multilayer board) process is described. In this approach on printed circuits so-called "via sheet" copper foil is required. The copper foil used here, which is coated with an insulating resin in two coating spaces, has a first layer largely prehardened. These foils are laminated onto the conductor plate with a roll laminator so that the conductor is jacketed in an air-bubble-free manner. This is only possible under use of vacuum. This laminating process is a highly sensitive process since the two-time coating of the copper foil already can give rise to significant damage to the copper foil. Any dust particle greater than 30 $\mu$m results in a hole in the copper and thus its useability. The holes can only be discovered after the lamination and give rise to the discarding of the entire circuit.

These problems of the current processes indicate how important it is to find ways to solve these technical requirements. A significant degree of difficulty has been found with the DYCOstrate process with flexible polyimide foils as well as with the BUM process with double coating of the copper foils in satisfying the future requirements of the new high-integration component generation.

OBJECT OF THE INVENTION

The present invention thus has as its object to provide a simple, technically easily controllable, economical process which can carry out the two-sided coating of printed-circuit boards in thicknesses of 10 to 200 $\mu$m to enable the production of two outer layers for a "pads only design" over a 100 $\mu$m thick flame-resistant photopolymerizable and chemically copper coatable insulating layer.

BRIEF DESCRIPTION OF THE DRAWING

The above and other objects, features, and advantages will become more readily apparent from the following description, reference being made to the accompanying drawing in which.

SPECIFIC DESCRIPTION

For this purpose, microbores of 50 $\mu$m diameter should be generated by photostructuring and the conductor and IC-terminals produced in a semiadditive process.

The solution of all of these ofjects and others which will become apparent subsequently are accomplished through a process. Especially advantageous is a process according to the invention for the coating of printed-circuit boards with a solder-stop lacquer or etch resist which is cross linkable by electromagnetic radiation, preferably UV radiation, and which is characterized by the following process steps carried out by the device shown in FIG. 1:

A photopolymerizable 70 to 95% coating agent with a viscosity of 10–20 Pa.s at 25° C., is preheated to 30° to 50° C. and is fed with a viscosity of 1 to 10 Pa.s from a supply vessel 5 (FIG. 1) to a two-sided roll coating apparatus whose metering rolls 3,4 (FIG. 1) which are thermostated to a temperature in the range of 25° to 60° C. to hold the viscosity constant and maintain the pumpability.

The thermostat 10 (FIG. 1) is connected to the metering rolls 3,4. The supply tank is located above metering rolls. The metering rolls 3,4 form a gap with the smooth rubberized applicator rolls 1,2 (FIG. 1) defining the desired film thickness.

The 10 to 20 mm thick rubberization has a hardness of preferably 40 to 60 shore hardness A. This rubberization is provided according to the invention with a diagonal or oscillating grooving with 100 to 500 $\mu$m width which is filled with a softer rubber layer of 10 to 20 shore A hardness and then has its surface ground smooth.

The applicator rollers 1,2 are cooled so that the surface temperature of 5° to 20° C. is generated. The coating film is brought to an application viscosity of 20 to 100 Pa.s so that it is possible to apply high solution containing layer thicknesses. The high viscosity serves together with the special roller surface to allow good matching to high conductors and prevents a squeezing out. The cooling apparatus 8 (FIG. 1) provides a uniform coating temperature. In this way according to the invention with a coating speed of 5 to 20 m/min, on both sides a 50 to 100 $\mu$m thick layer of a photopolymerizable coating agent is applied.

Figure 1:
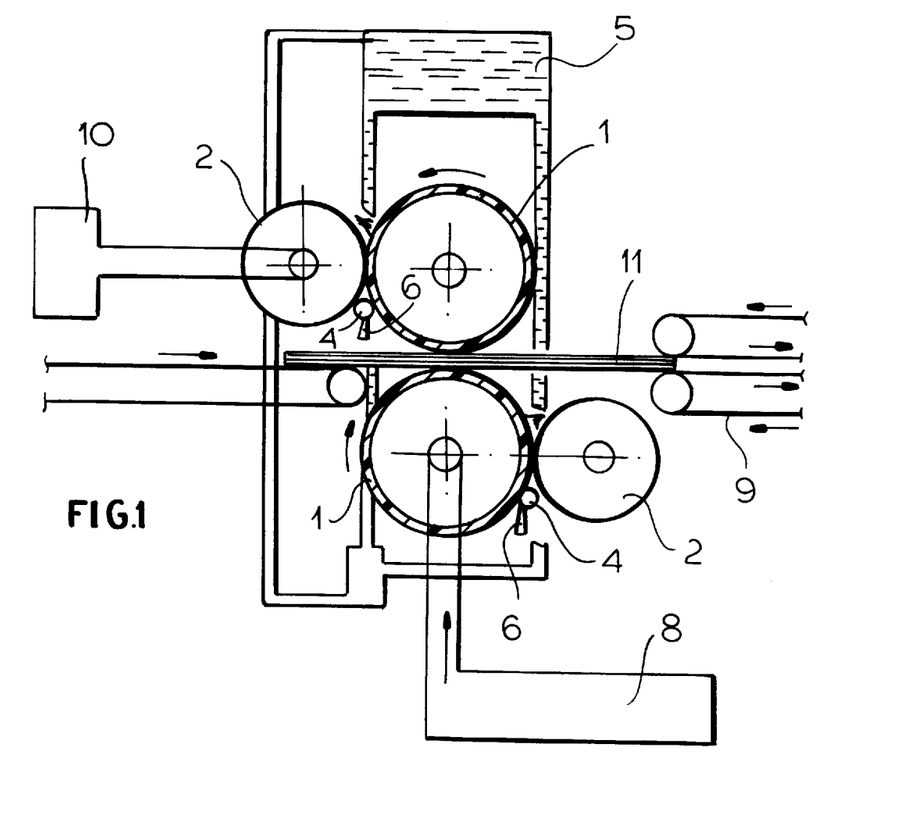
FIG. 1 is a diagrammatic view of a coating station according to the invention.
Figure 2:
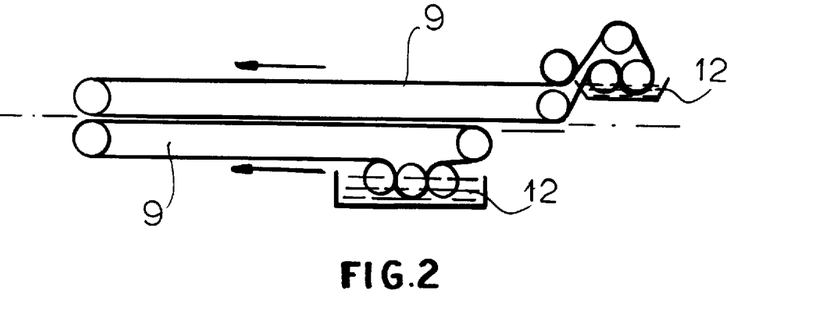
FIG. 2 is a diagrammatic view of a transporting means according to the invention.

To dry this film, the printed-circuit board must have a coating-free edge which is required for the transport 11 (FIG. 1).

This is achieved by the application of a heatable roller wiper 6 (FIG. 1) on the applicator rollers 1,2 which are cleaned by a blade wiper. The stripped-off coating agent is fed back to the supply tank 5.

To apply preferably coating thicknesses with a tolerance of less than 10% with thicknesses of 10 $\mu$m, 50 $\mu$m and 100 $\mu$m, a roller arrangement (FIG. 12) according to the invention is used which in the edge regions of the metering rolls 34 (FIG. 12) has a galvanic metallization 34 (FIG. 13) in the desired coating thickness.

Figure 12:
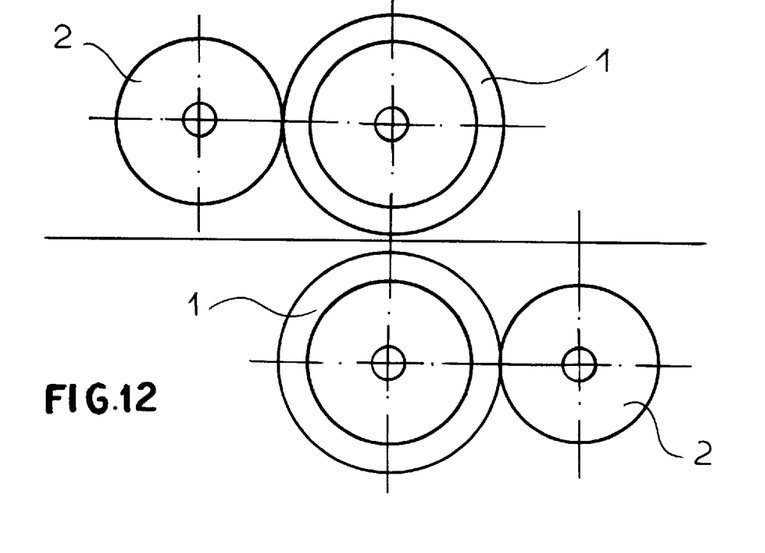
FIG. 12 is an enlarged diagrammatic view of the applicator and melting rolls according to the invention.
Figure 13:
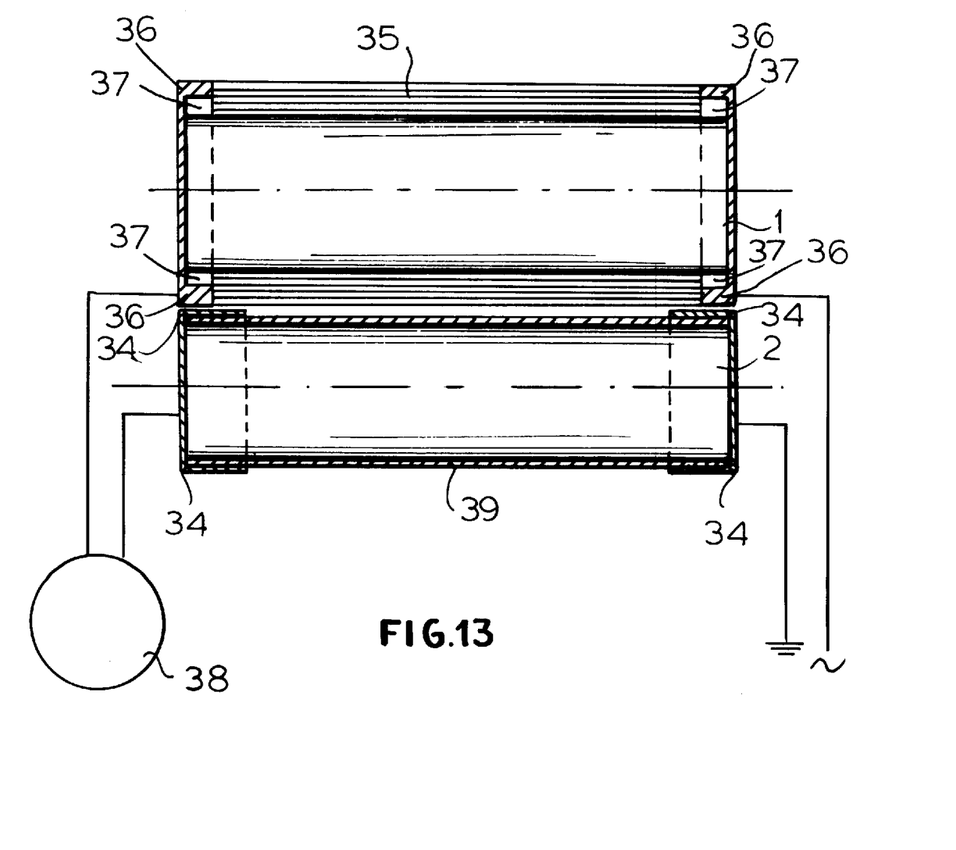
FIG. 13 is a longitudinal cross-sectional view of the rolls shown in FIG. 12.

This can preferably be a chromium or chromium/nickel coating in the thicknesses 10 $\mu$m, 50 $\mu$m and 100 $\mu$m. These, over an optional width of about 1 to 20 centimeters of a galvanically applied metal coating, allow a high degree of parallelity to be achieved. Simultaneously the precision of the roundness can be detected when these metallic layers lose their contact with the rubberized applicator rollers 1,2 (FIG. 12).

In order to ensure reliably the formation of a uniform thickness of the coating film, it must be ensured that these metal spacer coatings (FIG. 13,2) remain in contact with the applicator rollers without penetrating into the rubber jacket 35. This is accomplished according to the invention by the application of an electrically-conductive slide-contact or slip ring 37 which is applied to the rubber jacket at its edges and are ground to the same thickness.

If a voltage is applied to one of the conductive slip rings 37, a current begins to flow as seen as both rings have contact with the metal spacer layer 34 of the metering roller 3,4. Should there be detrimental roundness characteristics which give rise to an interruption of contact, this can be detected by a voltage measuring device 38 (FIG. 13) and corrected by a control or can shut down the apparatus. The conductive slip ring should have a thermal expansion characteristic similar to that of the rubber jacket, but should not be deformable. An insulation from the metal core of the applicator rollers is by the unit 37 made of conductive plastic, preferably of conductive hard netting and has a thickness of 10 to 20 μm and a width of 0.5 to 20 mm, whereby only the outer layer 36 is conductive.

Via a recorder the uniform current flow can be documented so that expensive testing of the substrates is not required. The width between two metal spacing layers 34 determines the coating width.

This apparatus according to the invention enables for the first time with layer thicknesses below 100 μm, a uniform layer distribution, indeed across the substrate width like over the length without requiring measurements of the coated substrate. Simultaneously, a coating-free edge is produced which is required for further transport with the substrate into the dryer.

These printed-circuit boards are transported according to the invention by adjustable width roller-guided double belts 1 (FIG.).

Figure 14:
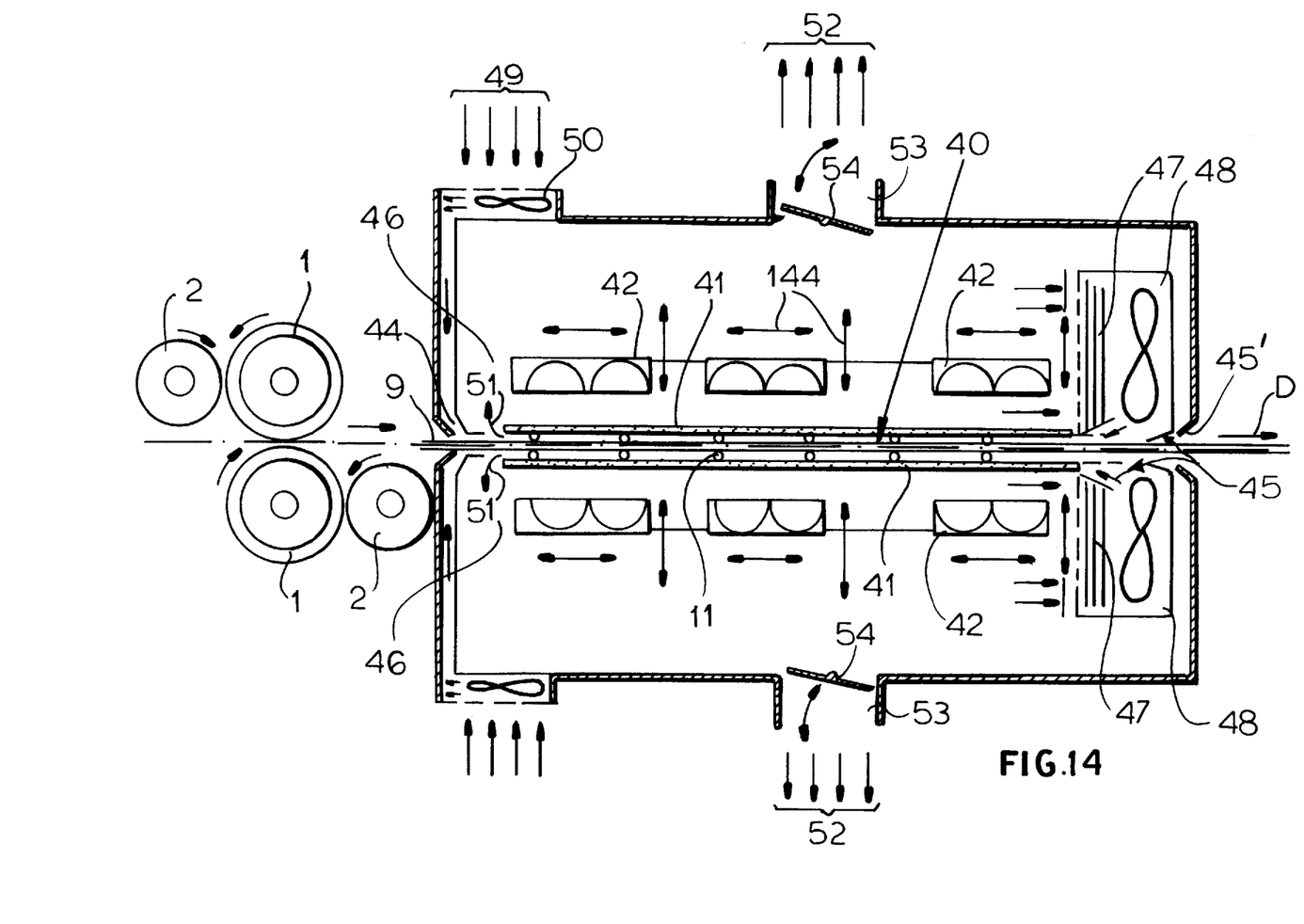
FIG. 14 is the drying station according to the invention.

The drying is effected according to the invention with an infrared convection laminar dryer (FIG. 14).

To enable a thick lacquer layer of greater than 50 μm to dry as soon as possible, a dryer is used which has a height of 20 to 150 mm, a width of 300 to 700 mm and a drying passage which can be 3 to 10 meters long, into 40 which preheated air is blown at high speeds of 5 to 40 m/s against the transport direction via broad-slit nozzles 45 which are provided above and below the guide plate transport unit (FIG. 14).

These high air speeds enable a rapid drying and leads to maintaining the dust particles in suspension and prevents them from depositing on the drying lacquer surface. Apart from this, a drive can generate, according to adjustment, different speeds to serve the means for supporting the printed-circuit boards.

The drying passage is covered on the upper and lower sides with glass panes 41 (FIG. 14) through which the infrared radiators 42 (FIG. 14) with a wavelength of 1 to 10 μm and which are vertically and horizontally movable as shown by arrows 144, heat the printed-circuit boards (FIG. 14). Thus the drying temperature profile can be individually matched to the lacquer layer thickness and to the printed-circuit board thicknesses individually.

The dryer inlet 44 (FIG. 14) and the outlet 45 (FIG. 14) are nozzle shaped. The air 51 is supplied as circulating air 42 (FIG. 14). It is heated both by the radiators (FIG. 14,4) and also by the heat exchanger (FIG. 14,17) to a regulatable and controllable temperature.

The circulating blower 48 (FIG. 14) is provided at the end of the dryer and sucks the air from the radiation chamber 47 to circulate it with a high speed through the drying passage 40 in counterflow.

The fresh air 49 (FIG. 14) is supplied by a fresh air blower 50 (FIG. 14) to a cooling unit connected to the dryer and traversed by the exhaust air from the dryer, the fresh air blower supplying air to the dryer inlet via two wide-slit nozzles disposed respectively above and below the transport device, the fresh air mixing with the solvent-containing air (FIG. 14,5) emerging from the drying passage.

The exhaust air 52 (FIG. 14) is carried off via an exhaust air opening 52 (FIG. 14) from the dryer whereby the quantity is controlled by an exhaust air flap 54 (FIG. 16).

In this manner, 50 μm thick lacquer layers with a solvent proportion of 10 to 20% can be dried in 60 seconds.

The width-adjustable roll wiper 6 (FIG. 1) enables a partial coating of the printed-circuit board so that not only can a strippable solder-stop lacquer be applied over plug conductors but it is also possible to form only a part of the printed-circuit board as a multi-layer circuit for manufacture of multi-chip modules.

After the drying, the printed-circuit board coated to a thickness of 50 μm is exposed to ultraviolet radiation with the use of a photo mask, developed and finally hardened.

Figure 3:
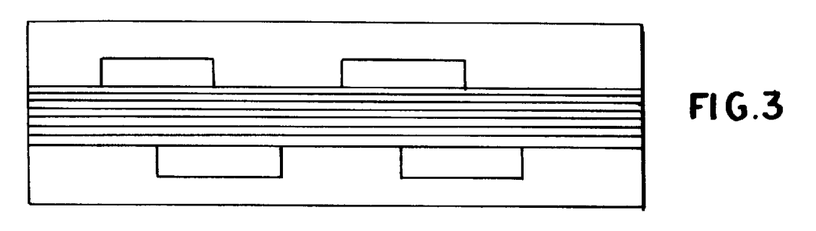
FIG. 3 is a diagrammatic view of a multi-chip module formed according to the inventive process before a drying stage.

For the production of multi-chip modules, a 100 μm thick layer of a photo polymerizable, thermally hardenable, flame resistant and copper coatable coating agent is applied in a two-sided roll process to the printed-circuit boards (FIG. 3).

Figure 4:
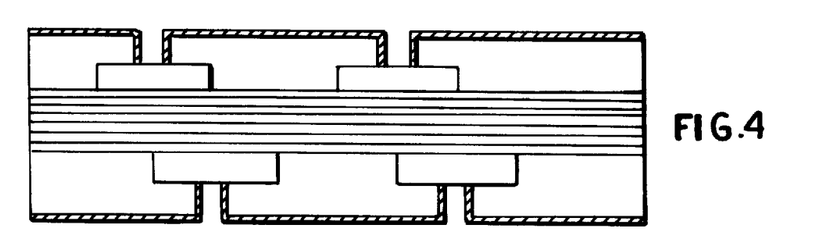
FIG. 4 is a diagrammatic view of a multi-chip module upon the roughening of the surface with a sulfuric acid and coating with copper to a thickness of up to 1 $\mu$m.
Figure 5:
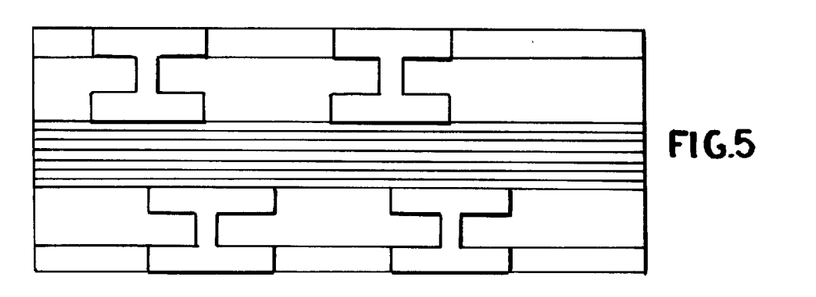
FIGS. 5 and 6 are diagrammatic views of the multi-chip module having different conductor patterns upon stripping the copper coating by 5% potassium hydroxide.
Figure 6:
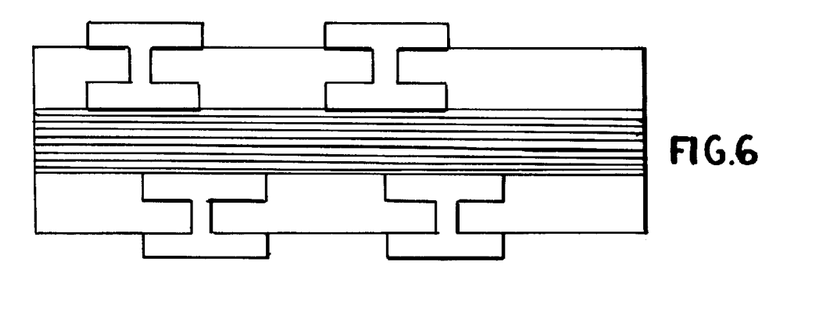

The flame resistance and copper coatability is achieved by the addition of a filler according to the invention to commercial solder stop lacquer. This acid soluble and flame resistant filler which has a sufficiently high thermal stability can be magnesium hydroxide. This coating agent according to the invention, after drying, is exposed to UV radiation of a wavelength of 350 to 400 nm utilizing a negative hole mask with 50 μm holes, the uncross-linked coating agent portion being liberated from the holes by development and the surface and hole walls being roughened with sulfuric acid and chemically copper coated to a thickness of 0.5 to 1 μm (FIG. 4). After the exposure and development of the bodies (IC- terminals) in widths of 100 to 200 μm, the holes and pads are galvanically reinforced to 20 μm. Comparable to the semiadditive technique, the coating contained after the galvanic copper coating is stripped with 5% potassium hydroxide and the conductor pattern generated by differential etching (FIG. 5 and FIG. 6).

Figure 7:
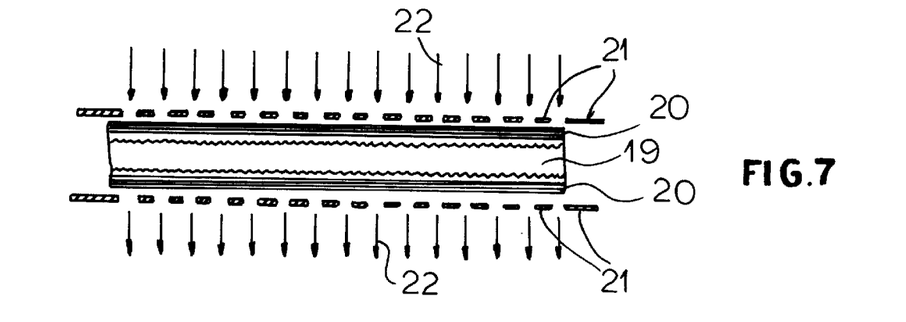
FIG. 7 is a diagrammatic view of the module formed by the semiadditive technique coated with 10 to 20 $\mu$m of the coating agent.
Figure 8:
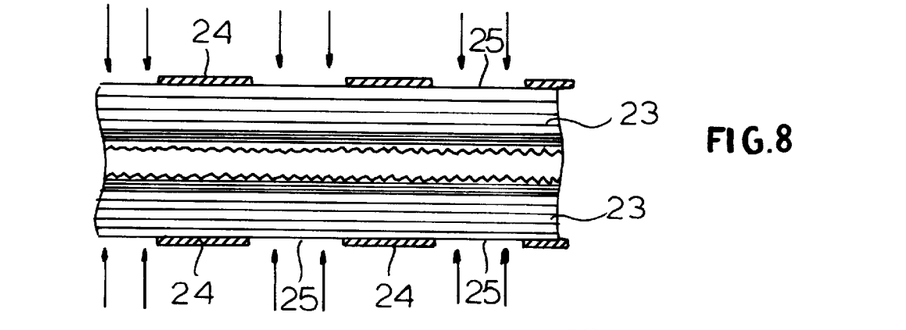
FIG. 8 is a diagrammatic view of the module according to FIG. 7, but coated with a second layer of the coating agent.

In a special embodiment of the process of the invention, circuits can also be formed by the semiadditive technique. For this purpose, uncoated printed-circuit board substrates are coated with 10 to 20 μm of the coating agent according to the invention. After the drying, this layer is photostructured (FIG. 7) with the aid of a perforation mask with hole diameters of 20 μm and spacing of 10 μm. Over this photostructured first layer, a second layer of 30 μm is applied. This can then be exposed with UV radiation following application of a conductor pattern foil (FIG. 8). The conductor-free regions are then cross-linked. The conductors and the conductor adhesion base are then developed and freed from the coating so that column-like regions are formed on the conductor adhesion base (FIG. 9,1) which have caverns between them (FIG. 9,2) so that good anchoring of the copper layer is ensured.

Figure 9:
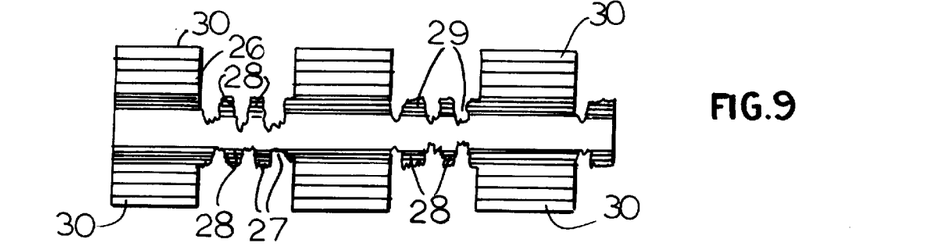
FIG. 9 is a diagrammatic view of the chip shown in FIG. 8 upon stripping the coating and forming column-like regions on the conductor adhesion base.

In conjunction with the development and drying, the surface of the coating agent is roughened with sulfuric acid and copper-coated chemically to a thickness of 1 μm (FIG. 9,3).

Figure 10:
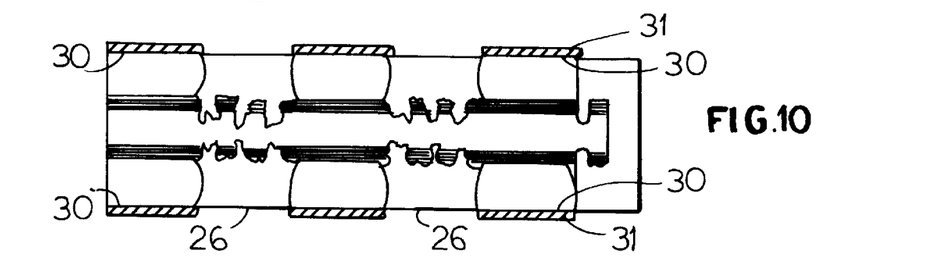
FIG. 10 is a diagrammatic view of the module shown in FIG. 7 but with a third copper layer.

After the copper coating, in a third coating process, a 20 μm thick layer of a coating agent is applied as a galvano-resist upon the conductive copper layer (FIG. 10,3) such that the conductor channels (FIG. 10,1) remain uncoated.

Figure 11:
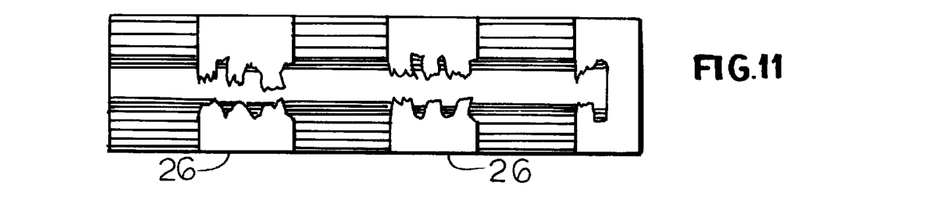
FIG. 11 is the module shown in FIG. 10 upon etching with ammonium persulfate.

After the drying the conductors (FIG. 10,2) are galvanically copper coated to 40 μm. After the copper coating the galvano-resist is stripped in 5% KOH and the conductive copper layer of 1 μm is etched with ammonium persulfate (FIG. 11).

This circuit is then coated with the coating agent according to the invention in a thickness of 50 μm and processed in the described manner into multi-chip modules.

EXAMPLE

Example 1

Solder stop masks are fabricated in thicknesses of 50 μm by application of solvent-poor high viscosity coating agents in a roller coating process.

| Printed-circuit boards: | |
|---|---|
| Basic material FR 4 | 1.6 mm |
| Conductor height | 50 μm |
| Conductor width | 150 μm |
| Temperature | 25 °C. |

Coating agent 1: silk screenable resist color composition according to DE 36 13 107 A1 Example 4
Component A

| | | |
|---|---|---|
| Resin (A-3) 50 Parts by weight (PPW) 70% in Cellosolveacetate Trimethylolpropane triacrylate | 4 PPW | |
| Pentaerythrite triacrylate | 4 PPW | |
| 2-Ethylanthraquinone | 3 PPW | |
| 2-Phenyl-4-benzyl-5-hydroxy-methylimidazol | 0.5 PPW | |
| "AC-300" | 1.0 PPW | |
| Phthalocyanine green | 0.5 PPW | |
| Calcium carbonate | 10 PPW | |
| | 75 PPW | 80 wt % |

Component B

| | | |
|---|---|---|
| "Epiclon EXA 1514" bis-Phenol-s-Type Epoxy resin of Dai-Nipppon Ink & Chemical | 10 PPW | |
| Trimethylolpropane triglycidylether | 4 PPW | |
| Cellosolve acetate | 6 PPW | |
| Calcium carbonate | 5 PPW | |
| | 25 PPW | 80 wt % |

Coating Agent 1:

7.5 parts by weight component A and 25 PPW. Component B 80 weight
percent 25 Pa.s 25° C.
Coating apparatus: roller coating apparatus according to FIG. 1, rubber jacket thickness 20 mm, hardness 50 shore A, grooving 200 μm
diagonal 45°, filling rubber hardness 20 shore A.

| | |
|---|---|
| Temperature applicator rolls | 5° C. |
| Temperature wiper | 90° C. |
| Temperature metering rolls | 40° C. |
| Application viscosity | 65 Pa.s |
| Tray viscosity | 2 Pa.s |
| Coating speed | 15 m/min |
| Roller gap | 60 μm |
| Layer thickness | 50 μm |
| Drying IR 1 to 10 μm | 120 seC |
| Temperature | 120° C. |
| Exposure UV 360 nm | 60 sec |
| Development in 1% Na$_2$CO$_3$ | 90 sec |
| Hardening 150° C. | 30 min |
| Results: Conductor covering 25 μm | Edge covering 13 μm |

Example 2

Production of multi-chip-modules by coating of printed-circuit boards fabricated by the subtractive or additive technique with 100 μm thick coatings of solvent-poor photopolymerizable chemically copper coatable and thermally hardenable, flame-resistant coating agent. Printed-circuit board :basic material FR 4 1.6 mm as in Example 1

Coating agent 2

| | | |
|---|---|---|
| Resin (A-3) | 50 PPW | 70% in Cellosolveacetate |
| Trimethylolpropane triacrylate | 4 PPW | |
| Pentaerythrite triacrylate | 4 PPW | |
| 2-Ethylanthraquinone | 3 PPW | |
| 2-Phenyl-4-benzyl-5-hydroxy-methylimidazol | 0.5 PPW | |
| "AC-300" | 1.0 PPW | |
| Phthalocyanine green | 0.5 PPW | |
| Magnesium hydroxide | 10 PPW | |
| | 75 PPW | 80% |

Component B

| | | |
|---|---|---|
| "Epiclon EXA 1514" bis-Phenol-S-Type Epoxy resin of Dai-Nipppon Ink & Chemical | 10 PPW | |
| Trimethylolpropane triglycidylether | 4 PPW | |
| Magnesium hydroxide | 11 PPW | |
| | 25 PPW | 100% |

Coating agent 2

75 parts by weight component A and 25 PPW. Component B 85 weight percent 50 Pa.s 25° C.
Coating apparatus:
Roller coating apparatus according to FIG. 1, rubber jacket thickness 20 mm, hardness 40 shore A.

| | |
|---|---|
| Temperature applicator rolls | 10° C. |
| Temperature wiper | 90° C. |
| Temperature metering rolls | 50° C. |
| Application viscosity | 90 Pa.s |
| Tray viscosity | 2 Pa.s |
| Coating speed | 5 m/min |
| Roller gap | 120 μm |
| Layer thickness | 100 μm |
| Drying IR 1 to 10 μm | 120 sec |
| Temperature | 100 ° C. |
| Exposure UV 360 nm | 90 sec Photofoil perforation diameter 50 μm |
| Development in 1% Na$_2$CO$_3$ | 120 sec |
| Chemical Copper coating 1 μm | |
| Etching in concentrated sulfuric acid | 60 sec RT |
| Neutralization 1N KOH | 5 min RT |
| Conditioning | 10 min 70 to 80° C. |
| Seeding (Palladium) | 5 min 42 to 46° C. |
| Acceleration | 5 min RT |
| Chemical copper plating 1 μm | 30 min 45 to 48° C. |
| Tempering 1 hour 100° C. | |

Example 3

Coating of the copper coated printed-circuit boards in the holes, bores and surface with a 20 μm coating of the coating agent 1, exposure with a conductor pattern (IC -terminals 200 μm), development and galvanic copper coating to 20 μm strip in 5% KOH and differential etching in aluminium persulfate.

Coating agent: Coating agent 1 Example 1 diluted to 70% 2 Pa.s 25% C.
Coating apparatus: roller coating apparatus according to FIG. 1 rubber jacket hardness 60 shore A.

| | |
|---|---|
| Temperature applicator rolls | 15° C. |
| Temperature wiper | 90° C. |
| Temperature metering rolls | 25° C. |
| Application viscosity | 20 Pa.s |
| Tray viscosity | 2 Pa.s |
| Coating speed | 20 m/min |
| Roller gap | 25 μm |
| Layer thickness | 21 μm |
| Drying IR 1 to 10 μm | 60 seC |
| Temperature | 80° C. |
| Exposure UV 360 nm | 60 sec |
| Development in 1% Na$_2$CO$_3$ | 60 sec |

-continued

Galvanic coating with copper to 20

| | |
|---|---|
| Current density 1.8 A/dm² | 30 min |
| Stripping 5% KOH, Etching 1 µm Cu in ammonium persulfate | 5 |
| Hardening 150° C. | 60 min. |

Example 4

Production of multi-chip-modules in the semiadditive technique by coating an uncoated substrate with 10 µm of the coating agent 2, photostructuring the conductor adhesion base by exposure with UV radiation using a perforated grid foil with holes of 20 µm diameter with 10 µm spacing. Coating with a 30 µm thick layer of the coating agent 2, exposure with UV radiation with conductor pattern photofoil, development of the conductors and the cavern shaped conductor adhesion base, chemical copper coating 1 µm, coating with a 20 µm layer of the coating agent 1 without filling the conductor channels, galvanic copper coating of the conductors and bores, stripping the coating agent and etching the 1 µm copper conductive layer.

Printed circuit board: basic material FR 4 1.6 mm uncoated $R_z$ 4 µm

| | |
|---|---|
| Coating Agent: Coating agent 2 diluted to 70% 10 Pa.s 25° S | |
| Coating apparatus: roll coating apparatus according to FIG. 1 as in Example 2. | |
| Temperature applicator rolls | 20° C. |
| Temperature wiper | 90° C. |
| Temperature metering rolls | 30° C. |
| Application viscosity | 20 Pa.s |
| Tray viscosity | 3 Pa.s |
| Coating speed | 20 m/min |
| Roller gap | 15 µm |
| Layer thickness | 11 µm |
| Drying IR 1 to 10 µm 90° C. | 60 seC |
| Exposure UV 360 Perforated mask 20 µm | 60 sec |

2. Coating: 30 µm as in Example 2 exposure UV 360 nm (printed- circuit board): 60 seconds.

Development of conductors and adhesion base with 1% $Na_2CO_3$: 90 seconds.

Chemical copper coating in the conductor channel and upon the surfaces 1 µm.

3. Coating: as in Example 3, 20 µm with coating agent 1. Galvanic copper coating to 40 µm: 1.8 A/dm² 60 min.

Stripping in 5% KOH. Etching in ammonium persulfide.

Further processing to multi-chip-modules as in Example 2 and Example 3.

I claim:

1. A process for coating opposite sides of a plurality of a printed-circuit boards, comprising the steps of:
    a) continuously passing a plurality of boards at room temperature through a nip formed between two spaced apart rubber jacketed applicator rolls;
    b) delivering a photopolymerizable coating agent having a solids content of 70 to 95% by weight and a viscosity of 10 to 60 Pa.s. at 25° C. to a respective gap formed between each of the applicator rolls and a respective metering roll defining a desired film thickness therebetween;
    c) cooling the surfaces of said applicator rolls 5° to 20° C. and maintaining surfaces of said metering rolls at temperature of 25° to 60° C. to maintain said coating agent in a viscosity range of 1 to 10 Pa.s. for coating onto the surfaces of the applicator rolls while keeping opposite edge regions of the applicator rolls free from the coating agent;
    d) transferring said coating agent to opposite sides of each of the boards passing through said nip from said application rolls with an application viscosity of 20 to 100 Pa.s at a coating speed of 5 to 20 m/min to form film thicknesses of 10 to 200 µm of the coating agent on the boards; and
    e) thereafter drying said film thicknesses at 80° to 120° C. for 60 to 120 seconds.

2. The process defined in claim 1 further comprising the steps of:
    f) illuminating the respective board with ultraviolet radiation to photostructure each of the printed-circuit board through a perforated mask having holes, thereby developing noncross-linked hole regions between cross-linked perforated regions having microbores on each side of the respective board;
    g) thereafter acid roughening said boards;
    h) thereafter galvanically coating said boards with a copper layer having a thickness of up to 1 µm;
    i) repeating the steps (b) through (h) to form the respective dried board having copper coating thicknesses of 10 to 20 µm; and
    j) generating IC terminals of 100 to 200 µm width over said microbores.

3. The process defined in claim 2 wherein each of said boards is provided with a structure formed in step (h) which has column-shaped formations and cavern shaped depressions receiving the deposited copper.

4. The process defined in claim 1 wherein said coating agent includes an acid soluble and flame resistant filler with a particle size of 3 to 10 µm in an amount of 10 to 60 parts by weight.

5. The process defined in claim 4 wherein said filler is magnesium hydroxide.

6. A device for coating opposite sides of a plurality of printed circuit boards comprising:
    transport means for continuously delivering a plurality of uncoated boards along a path in a coating plane; and
    a coating station along the path including
        reservoir means for storing a coating agent to be coated on opposite sides of the respective board,
        a pair of spaced apart applicator rolls each provided with a respective ground rubber jacket and defining therebetween a nip which lies in said coating plane,
        a pair of metering rolls each juxtaposed with a respective one of said applicator rolls operatively connected with the reservoir means,
        thermoregulating means for controllably heating said metering rollers at 25° to 60° C. to apply the coating agent having an initial viscosity of 1 to 10 Pa to the applicator rolls, the applicator rolls being cooled to a temperature of 5° to 20° C., and
        squeegee means operatively connected with said metering rolls for stripping opposite end regions of each of the applicator rolls from the coating agent, said coating agent, brought to said nip by said applicator rolls, having a final viscosity of 20 to 100 Pa.s upon depositing on the opposite sides of the respective board.

7. The device defined in claim 6 wherein each of said metering rolls is an electrically heated, 60° to 90° C. chromium-plated roll having a diameter of 10 to 50 mm so that said coating agent is brought in said end regions to a viscosity of 100 to 200 mPa.s, said squeegee means including a plurality of blade wipers each juxtaposed with a respective one of said end regions of the respective applicator roll and adapted to wipe off the coating therefrom, said coating being evacuated to the reservoir means upon stripping.

8. The device defined in claim 6 wherein each of said metering rolls is provided with a respective 10 to 100 mm wide and 10 to 200 mm metal spacer mounted on each end of the respective metering roller, each of said applicator rolls being formed with a respective pair of slip rings, each slip ring being mounted on the respective end region of the applicator roll and being made of a conductive plastic material and having a diameter of 200 mm, said slip rings being pressed into respective spacer at depth of 35 to 500 $\mu$m.

9. The device defined in claim 8 wherein said drying means is a radiation-convection-laminar layer dryer spaced downstream from the coating station and including:

a housing having a height of 20 to 150 mm, a width of 300 to 700 mm and a length of 3 to 10 m, a central channel receiving said printed-circuit boards and provided with nozzle-shaped inlet and outlet of said housing along said path and lying in said coating plane;

a plurality of rollers guiding a double belt lying in said channel along said path and transporting said boards in a transport direction in said housing;

means for controlling air flow speeds within a 5 to 40 m/sec range and directing said flow through said nozzle-shaped outlet against the transport direction above and below said coating plane;

glass panes in said housing above and below said coating plane and along the path; and a plurality of vertically and horizontally movable infrared radiators spaced outwardly from said glass panes and having a wavelength of 1 to 10 $\mu$m.

10. The device defined in claim 6 wherein each rubber jacket has a thickness of 10 to 20 mm and a hardness of 10 to 60 shore A with diagonal or undulating grooves, each of the grooves being from 100 to 500 $\mu$m in width and depth.

* * * * *